United States Patent [19]

Goggin

[11] Patent Number: 4,590,439

[45] Date of Patent: May 20, 1986

[54] FREQUENCY SYNTHESIZING CIRCUIT

[75] Inventor: John C. Goggin, Dallas, Tex.

[73] Assignee: E-Systems, Inc., Dallas, Tex.

[21] Appl. No.: 607,636

[22] Filed: May 7, 1984

[51] Int. Cl.$^4$ ............................................. H03L 7/00
[52] U.S. Cl. .................................. 331/1 A; 331/25; 331/60; 331/74; 331/177 V
[58] Field of Search ............... 331/1 A, 25, 36 C, 60, 331/74, 76, 77, 177 V; 307/291; 337/47, 116, 120

[56] References Cited

U.S. PATENT DOCUMENTS

| 3,579,281 | 5/1971 | Kam | 331/177 V X |
| 3,701,040 | 10/1972 | Borrevik et al. | 331/74 X |
| 4,068,198 | 1/1978 | Otto | 331/25 X |
| 4,463,321 | 7/1984 | Horner | 331/25 X |

FOREIGN PATENT DOCUMENTS 0009939 8/1980 European Pat. Off. ............. 331/25

Primary Examiner—Eugene R. LaRoche
Assistant Examiner—James C. Lee
Attorney, Agent, or Firm—Albert M. Crowder, Jr.

[57] ABSTRACT

A frequency synthesizer circuit of the phase-locked loop type for receiving a reference signal and generating in response thereto a plurality of local oscillator (LO) output signals is provided. The synthesizer includes a varactor-controlled oscillator having one or more hyperabrupt varactor tuning diodes for providing an octave bandwidth phase-locked loop output RF, and a plurality of series-connected emitter-coupled logic (ECL) circuits connected to the output of the varactor-controlled oscillator for generating a plurality of local oscillator output signals RF/N, where $N=2^x$, $x=1, 2, 3$ .... The frequency synthesizer also includes a programmable frequency divider in the feedback loop thereof for reducing the frequency of the phase-locked loop output signal RF by a selectable factor.

17 Claims, 4 Drawing Figures

FREQUENCY SYNTHESIZING CIRCUIT

TECHNICAL FIELD

The present invention relates generally to frequency synthesis techniques and more specifically to a high performance frequency synthesizing circuit that functions as a broadband system of local oscillators.

BACKGROUND OF THE INVENTION

State-of-the-art VHF/UHF frequency synthesizers typically employ a series of local oscillators to produce a wide bandwidth of output frequencies. However, such synthesizers are usually costly and complicated, and exhibit less than satisfactory performance. In particular, these frequency synthesizers have low output power levels, poor frequency accuracy and stability, long tuning time, and have unacceptable levels of carrier intermediate frequency modulation (IFM). To overcome these and other problems of prior art frequency synthesizers requires considerable circuitry, thus resulting in very high cost low reliability equipment.

Frequency synthesis techniques employing phase-locked loop circuits for producing synthesized signals over a relatively wide range of frequencies are also well-known. Such phase-locked loop frequency synthesizers are simple servo systems in which an error signal, proportional to the phase difference between a feedback signal and a reference signal, is generated within a phase detector circuit. After filtering, this error signal is utilized to control the frequency of a voltage-controlled oscillator (VCO), which supplies the system output signal. It is also known to provide a programmable frequency divider circuit within the feedback loop of the synthesizer for reducing the frequency of the feedback signal by a selectable factor. Such a circuit is shown in U.S. Pat. No. 4,290,028 to LeGrand.

Although frequency synthesis techniques as described in the LeGrand patent are capable of producing a plurality of selectable output frequencies, such techniques have not been used to replace the state-of-the-art VHF/UHF frequency synthesizers employing a series of local oscillators. This is because the VCO employed in such phase-locked loop frequency synthesizers is not designed to produce an accurate and stable frequency output signal. Moreover, since the time required to switch from one output frequency to another is inversely proportional to the reference frequency, and noise performance is generally degraded as this frequency is decreased, such circuits often cannot simultaneously achieve the desired output bandwidth and frequency resolution of a series of local oscillators. Further, the phase-locked loop frequency synthesizers do not exhibit the requisite switching speed and level of noise suppression.

Accordingly, there is a need to provide a phase-locked loop frequency synthesizing circuit which can function as a VHF/UHF frequency synthesizer employing a series of local oscillators.

SUMMARY OF THE INVENTION

According to the present invention, a high performance frequency synthesizing circuit replaces a broadband system of local oscillators typically employed to produce a wide bandwidth of output frequencies. In the preferred embodiment, the frequency synthesizing circuit is of the phase-locked loop type for receiving a reference signal and generating a plurality of local oscillator output signals.

The circuit preferably includes a varactor-controlled oscillator having an input, and an output for providing a phase-locked loop output signal RF over an octave bandwidth. A phase detector is also provided having first and second inputs, and an output connected to the input of the oscillator. The first input of the phase detector is connected to receive the reference signal. To control the frequency range of the phase-locked loop output signal RF, a programmable divider is provided having an input connected to the output of the oscillator, and an output connected to the second input of the phase detector. The programmable divider is placed in the feedback loop of the frequency synthesizer for reducing the frequency of the phase-locked loop output signal RF by a selectable factor.

According to an important feature of the present invention, a wide bandwidth of output frequencies is provided by the frequency synthesizing circuit through a plurality of series-connected emitter-coupled logic circuits connected to the oscillator. In particular, the emitter-coupled logic circuits receive the phase-locked loop output signal RF and generate in response thereto the plurality of local oscillator (LO) output signals RF/N, where $N=2^x$, $x=1, 2, 3 \ldots$.

BRIEF DESCRIPTION OF THE DRAWINGS

For a more complete understanding of the present invention and the advantages thereof, reference is now made to the following Description taken in conjunction with the accompanying Drawings, in which.

DETAILED DESCRIPTION

Figure 1:
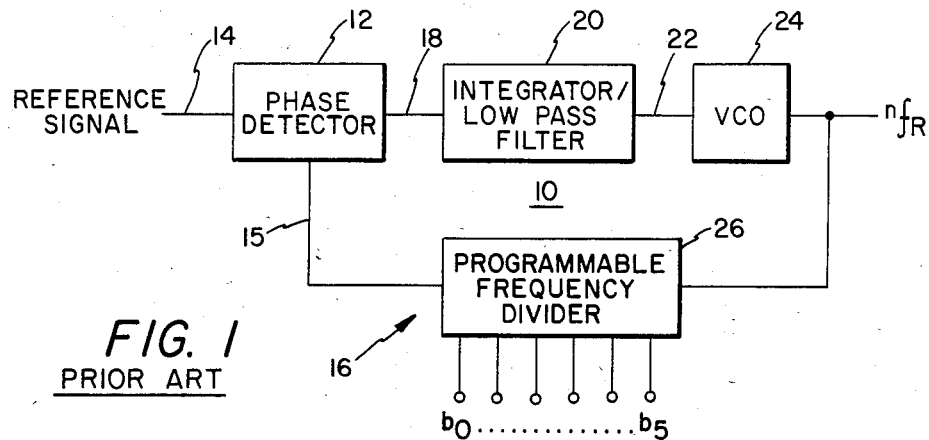
FIG. 1 is a block diagram of a prior art phase-locked loop frequency synthesizer.

With reference now to the FIGURES wherein like reference characters designate like or similar parts throughout the several views, FIG. 1 is a block diagram of a prior art phase-locked loop frequency synthesizing circuit. This circuit, represented generally by the reference numeral 10, includes a phase detector 12 for receiving a reference signal via line 14. The phase detector 12 is typically a sample and hold device, and serves to compare the phase of the reference signal with the phase of a feedback signal introduced thereto via line 15 from a feedback loop 16. The output of the phase detector 12; i.e., the phase difference between the feedback and reference signals, is then coupled via the line 18 to an integrator/low pass filter 20 which produces a d.c. voltage proportional to this output. This d.c. voltage is applied via the line 22 to a voltage-controlled oscillator (VCO) 24. The VCO 24 supplies the system output signal, the frequency of which is controlled by the d.c. voltage applied thereto via line 22.

As also seen in FIG. 1, a programmable frequency divider circuit 26 is provided in the feedback loop 16 to reduce the frequency of the system output signal according to a binary control signal input on the terminals $b_0-b_5$. In operation, system output frequency control is effected by the programmable frequency divider 26 connected for receiving the output signal of the VCO 24. The programmable frequency divider 26 serves to reduce the frequency of the feedback signal by a selectable factor n and, since the loop will synchronize or lock when the phase of the feedback signal is substantially identical to the phase of the reference signal, the divider 26 causes the VCO 24 to supply a signal at the frequency $nf_R$ where $f_R$ is the frequency of the reference signal.

Figure 2:
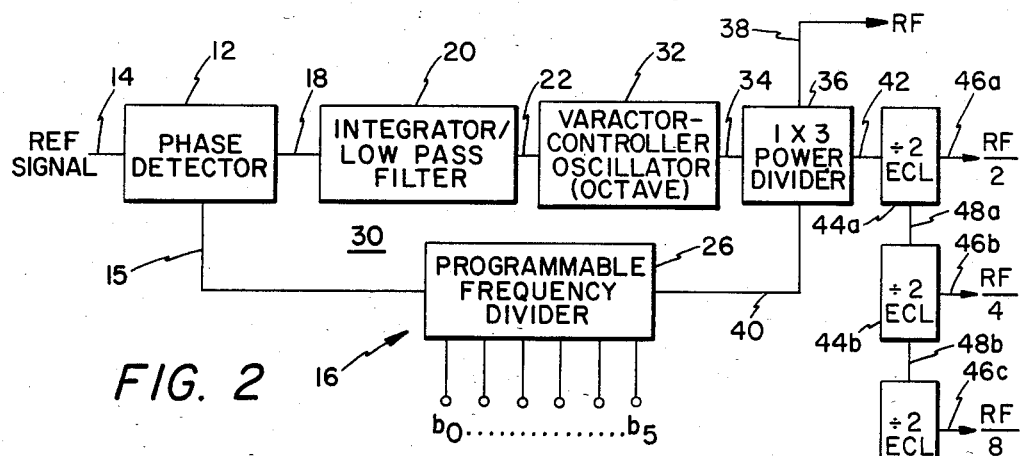
FIG. 2 is a block diagram of the frequency synthesizing circuit of the present invention for generating a plurality of local oscillator (LO) output signals.

Referring now to FIG. 2, a block diagram of the frequency synthesizing circuit of the present invention, represented generally by the reference numeral 30, is shown. The circuit 30 includes a phase detector 12 having first and second inputs, the first input for receiving a reference signal via line 14, the second input provided via line 15 from a feedback loop 16. As discussed above with respect to FIG. 1, the phase detector 12 compares the phase of the feedback signal supplied by a programmable frequency divider 26 in the feedback loop 16 with the phase of the reference signal to produce an error signal having a magnitude proportional to the phase difference between these signals. Since frequency is the derivative of phase with respect to time, the error signal output from the phase detector 12 on line 18 is accordingly related to the difference in frequency between the feedback signal supplied by the programmable frequency divider 26 and the reference signal. The error signal is passed through the integrator/low pass filter circuit 20 to produce a d.c. voltage proportional to this phase and frequency difference on line 22, which is then supplied to control the frequency of a varactor-controlled oscillator 32. The varactor-controlled oscillator 32 replaces the conventional voltage-controlled oscillator, such as the VCO 24 shown in FIG. 1.

The output of the varactor-controlled oscillator is a phase-locked loop output signal RF which is applied via line 34 to a 1×3 power divider circuit 36. Divider circuit 36 receives the output signal RF from the varactor-controlled oscillator 32 and generates three replicas of this output signal. A first replica of the output signal RF from the power divider 36 serves as an RF output of the synthesizer via line 38. A second replica of the output signal RF is applied from the power divider 36 via line 40 to the input of the programmable frequency divider 26. Finally, a third replica of the output signal RF is applied from the power divider 36 via line 42 to a series of emitter-coupled logic (ECL) circuits 44a–44e which, as will be described below, produce a plurality of local oscillator (LO) output signals RF/N, where $N=2^x$, $x=1, 2, 3 \ldots$.

Generally, the operation of the frequency synthesizer of FIG. 2 is similar to the operation of the phase-locked loop frequency synthesizing circuit of the prior art. As noted above, the phase detector 12 operates to compare the phase of the reference signal with the phase of the feedback signal supplied by the programmable frequency divider 26, to produce an error signal having a magnitude proportional to the phase difference between these signals. This error signal is then converted to a proportional d.c. voltage which is used to control the frequency of the varactor-controlled oscillator 32. When the error signal is minimized, the circuit is synchronized or locked and the two signals applied to the phase detector 12 are substantially identical in frequency. When synchronization occurs, the varactor-controlled oscillator 32 supplies the desired output signal RF to the power divider circuit 36.

As discussed above, this output signal RF is also applied to the series of ECL circuits 44a–44e which according to the present invention produce a plurality of local oscillator (LO) output signals RF/N, where $N=2^x$, $x=1, 2, 3 \ldots$. Specifically, in the preferred embodiment each of the ECL circuits 44a–44e is a divide-by-two circuit. The output signal RF from the power divider circuit 36 on line 42 is applied to the first divide-by-two ECL circuit 44a, which generates an output signal RF/2 on the output line 46a. As will be described in more detail below, the ECL circuit 44a is also connected to the ECL circuit 44b via line 48a. Since ECL circuit 44b is also a divide-by-two circuit, an output signal RF/4 is produced thereby on the output line 46b. Similarly, ECL circuit 44b is connected to ECL circuit 44c via line 48b, circuit 44c generating an output signal RF/8 on the output line 46c. The remainder of the ECL circuits are similarly connected to produce the plurality of local oscillator (LO) output signals RF/N, where $N=2^x$, $x=1, 2, 3 \ldots$.

Therefore, in accordance with the present invention, the voltage-controlled oscillator of a prior art phase-locked loop frequency synthesizing circuit is replaced by the varactor-controlled oscillator 32 of FIG. 2. This replacement is advantageous since the VCO employed in such prior art phase-locked loop frequency synthesizers is not designed to produce an accurate and stable output signal. Such frequency synthesizing circuits are thus not readily adaptable for producing a wide bandwidth of output frequencies; i.e., are incapable of functioning as a broadband system of local oscillators. Moreover, if such prior art phase-locked loop frequency synthesizing circuits are utilized to produce broadband frequency signals, poor performance is obtained. In particular, since the time required to switch output frequencies is inversely proportional to the reference frequency, and noise performance is generally degraded as the frequency is decreased, such prior art circuits cannot achieve the desired output bandwidth and frequency resolution of a series of local oscillators. Further, phase-locked loop frequency synthesizers do not exhibit the requisite switching speed and level of noise suppression for certain system applications.

These and other problems of the prior art are ameliorated by the present invention through the use of an accurate broadband varactor-controlled oscillator 32 which is capable of linearly tuning an octave bandwidth. Moreover, the present invention produces a wide bandwidth of output frequencies; i.e., a plurality of local oscillator output signals, by successively dividing the output of the varactor-controlled oscillator by a series of ECL circuits 44a–44e. As will be described in more detail below, the ECL circuits divide the octave output of the varactor-controlled oscillator to produce the plurality of local oscillator output signals, each of these signals having a constant amplitude over its respective octave bandwidth.

Figure 3:
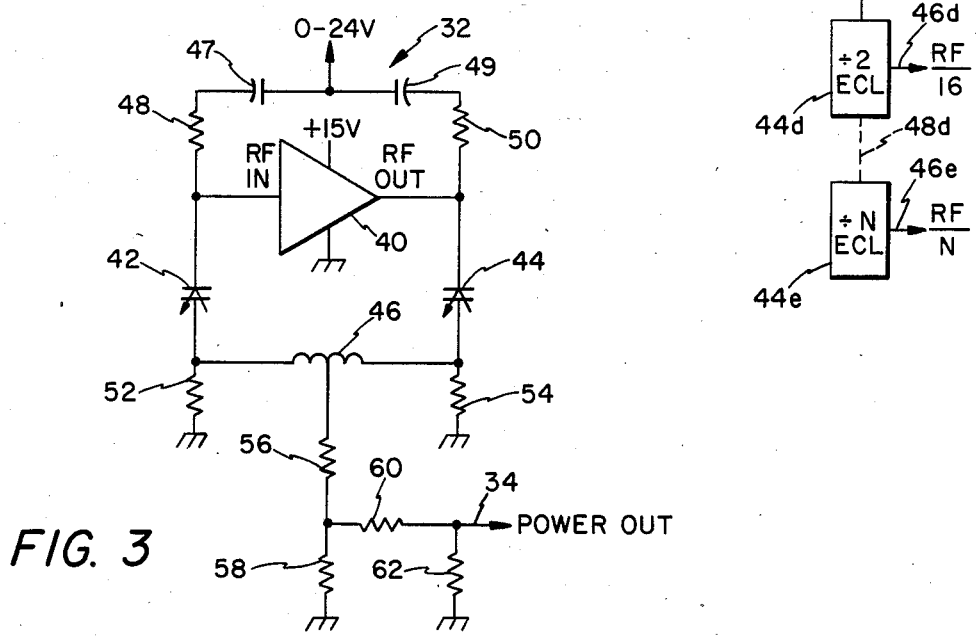
FIG. 3 is a schematic diagram of the varactor-controlled oscillator of FIG. 2.

Referring now to FIG. 3, a detailed schematic of the varactor-controlled oscillator 32 of FIG. 2 is shown. The oscillator includes an operational amplifier 40, having in-phase RF input and outputs, which is designed to operate over a 10 to 1500 mHz bandwidth. The operational amplifier 40 has a noise figure of approximately 7.0 dB from 0° to 50° C. The bandwidth of the varactor-controlled oscillator is set via first and second microwave hyperabrupt varactor tuning diodes 42 and 44 and the inductor 46 operating in a series mode. Such microwave hyperabrupt varactor tuning diodes are well-known in the prior art and are normally designed for linear wideband tuning of microwave filters and resonators. Such linear tuning is not possible with conventional abrupt-junction tuning diodes, and is accomplished by maintaining an accurate silicon doping profile using ion-implantation precision control techniques. Each varactor tuning diode operates as a voltage-controlled capacitor.

Referring back to FIG. 3, the operational amplifier 40 also includes chip capacitors 47 and 49 and trim resistors 48 and 50, connected between the amplifier's input and output terminals, respectively, and a tuning voltage input source. This input voltage, which can vary from 0–24 volts d.c., is provided from the integrator/low pass filter 20 as discussed above with respect to FIG. 2. The varactor-controlled oscillator 32 also includes load resistors 52 and 54 connected between the inductor 46 and ground, and a source resistor 56 connected to a center tap of the inductor 46. This center tap serves as the output of the oscillator circuit, and is coupled via the source resistor 56 to a 3 dB resistor pad comprising resistors 58, 60 and 62. Specifically, resistor 58 is connected between the source resistor 56 and ground and resistors 60 and 62 form a voltage divider, the output of which is supplied via the line 34 to the power divider circuit 36 of FIG. 2.

The varactor-controlled oscillator 32 of FIG. 3 is designed to produce an output over the frequency range of approximately 650 mHz to 1104 mHz. Power variance using this circuit is less than ±1.5 dB.

Referring simultaneously to FIGS. 2 and 3, the signal output from the varactor-controlled oscillator 32 is applied via the line 34 to the 1×3 power divider circuit 36. As is well-known in the prior art, the three-way power divider circuit produces three replicas of the phase-locked loop output signal RF at the terminals 38, 40 and 42. Subsequently, one of the outputs of the power divider circuit 36 is applied via line 42 to the ECL circuits 44a–44e.

Figure 4:
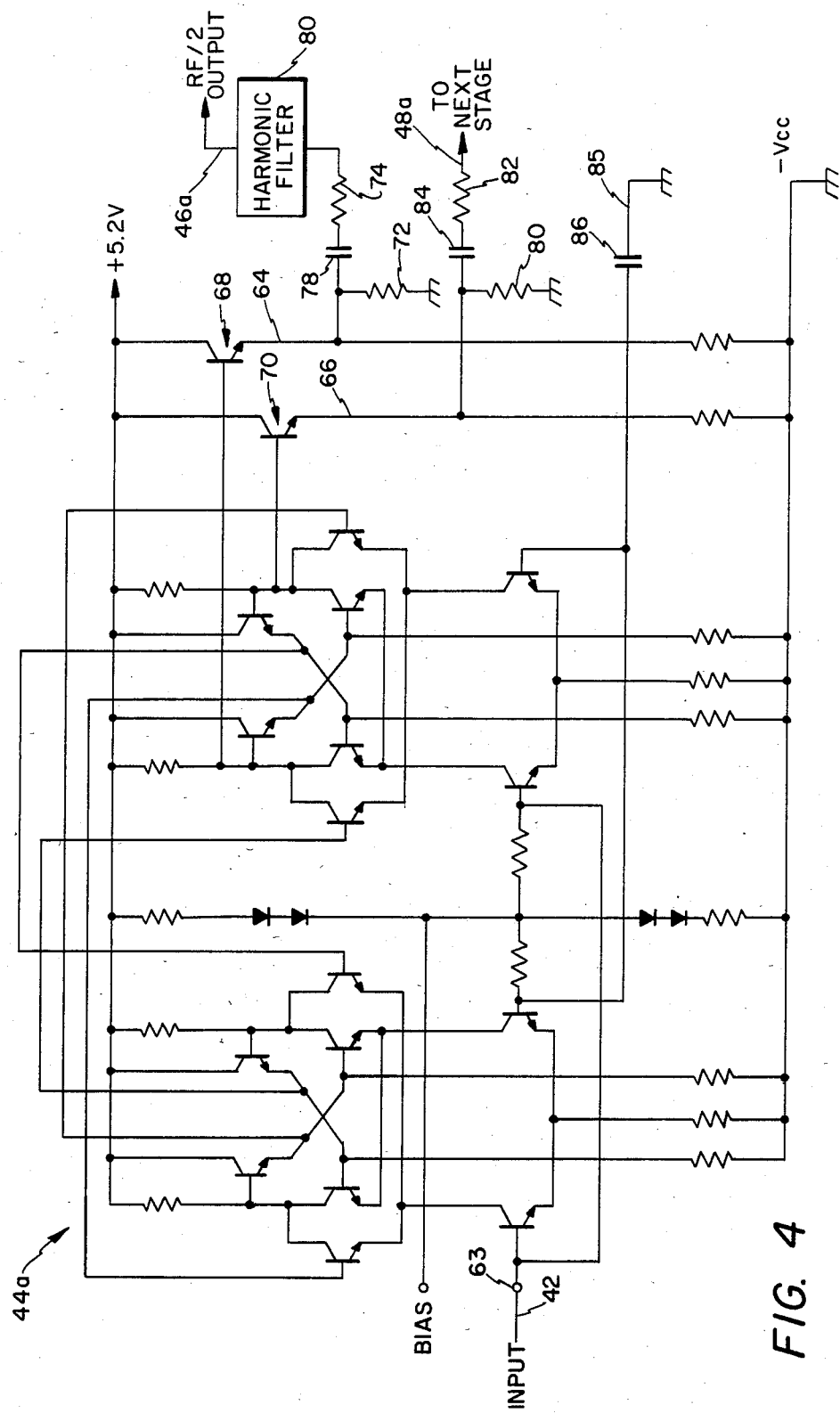
FIG. 4 is a schematic diagram of one of the divide-by-two emitter-coupled logic circuits of FIG. 2.

Referring now to FIG. 4, a detailed schematic of one of the divide-by-two ECL circuits of FIG. 2 is shown. In the preferred embodiment of the invention, the ECL circuits 44a–44e are integrated circuit dividers which operate at high frequencies and at low power levels from the use of emitter-coupled switching circuits. FIG. 4 discloses a detailed schematic diagram of a Model SP8602 high speed divide-by-two circuit, which is manufactured by Plessey Semiconductors. This device can be operated with single input drive or double "complementary" input drive; in both cases the input is normally capacitively coupled to the signal source. In the present invention, the output of the power divider 36 is applied to the ECL circuit 44a of FIG. 4 to a single input terminal 63 of the high speed divider circuit via the line 42. Two complementary emitter follower outputs, 64 and 66, are provided from the transistors 68 and 70, respectively. The first complementary emitter follower output 64 is connected to an RC network comprising resistors 72 and 74, and capacitor 78; and then coupled to a harmonic filter 80. The output of the harmonic filter forms the local oscillator output signal RF/2 on line 46a. Likewise, the second complementary emitter follower output 66 is coupled to a next stage of the ECL circuits through an RC network comprising resistors 80 and 82, and capacitor 84. This second complementary emitter follower output thus serves as the input to the next divide-by-two circuit 44b as discussed above with respect to FIG. 2. As also seen in FIG. 4, the second input 85 of the divide-by-two circuit is connected to ground through a capacitor 86. Moreover, the negative supply of this circuit is also connected to ground and the positive supply is connected to a source of +5.2 volts.

As noted above, the divide-by-two circuit 44a may be provided either with complementary clock inputs or reference bias points. To exploit the circuit's full sensitivity and frequency specification, the reference bias points should be decoupled to the system's RF ground. A suitable value for this decoupling capacitor is 1000 pF. Accordingly, capacitors 78 and 84 in the circuit of FIG. 4 have a value of 1000 pF. Moreover, the positive supply of the divide-by-two circuit 44a is utilized as a ground plane since this ensures that the poor immunity of ECL gates with respect to their positive supply is not a performance hazard. In the preferred embodiment, each of the divide-by-two circuits 44a–44e of FIG. 2 may comprise the circuit shown in FIG. 4. As discussed above, these divide-by-two circuits are series-connected to form the plurality of local oscillator output signals RF/N, where $N=2^x$, $x=1, 2, 3 \ldots$.

Therefore, according to the present invention the function of a prior art VHF/UHF frequency synthesizer employing a plurality of local oscillators is provided by a phase-locked loop frequency synthesizer utilizing a varactor-controlled oscillator. This oscillator has excellent performance due to the use of hyperabrupt tuning varactor diodes which facilitate the provision of an octave bandwidth output signal therefrom. Further, this octave bandwidth output signal is used as one of the RF power outputs from a power divider circuit. Since the varactor-controlled oscillator produces an octave frequency range, each subsequent division by the ECL circuits also covers one octave. For example, if the output of the varactor-controlled oscillator covers a frequency range of 650 mHz to 1104 mHz, then the RF/2 output from the ECL circuit 44a covers the frequency range of 325 mHz to 552 mHz. Likewise, the RF/4 output from the ECL circuit 44b would then cover the frequency range from 162.5 mHz to 276 mHz, etc.; down to the minimum local oscillator frequency required.

The voltage tuning range of the varactor-controlled oscillator is determined by the characteristics of the hyperabrupt tuning varactor diodes utilized. Hyperabrupt varactor diodes require maximum tuning voltages of 20 volts and have nonlinear characteristics such that when used in a conventional LC tuning network, linear tuning across the bandwidth of interest is provided. Moreover, although usually a greater local oscillator bandwidth requires greater tuning sensitivity and thus more intermediate frequency modulation (IFM) to contend with, the circuit of the present invention overcomes this problem if the design criteria for IFM is met for the output of the varactor-controlled oscillator. In particular, if this design criteria for IFM is met, then by dividing this output by RF/2 to RF/N, IFM will be decreased due to the increase in the spectral power density due to such division. Moreover, although the power level of the varactor-controlled oscillator may have as much as 3 dB variation across the octave bandwidth output, the output power from the ECL circuits will be typically 0 to −2 dBm across the entire band of RF/2-RF/N frequencies. Moreover, the use of a harmonic filter as described above with respect to FIG. 4 serves to maintain symmetrical balanced loads on the ECL circuit to minimize the second and third harmonic outputs.

Note that the integrated circuit 44a shown in FIG. 4 may be replaced by other suitable divide-by-two circuits, depending on the desired frequency range of the synthesizing circuit. For example, Model SP8605B and SP8606B divide-by-two circuits, also manufactured by Plessey Semiconductors, may be utilized either singularly or in combination with the Model SP8602, to produce the RF/N output signals.

Although the invention has been described in detail, it is to be clearly understood that the same is by way of illustration and example only and is not to be taken by way of limitation, the spirit and scope of the invention being limited only to the terms of the appended claims.

I claim:

1. A frequency synthesizer of the phase-locked loop type for receiving a reference signal and generating a plurality of local oscillator output signals, comprising:
   a varactor-controlled oscillator means comprising an RF operational amplifier having an input terminal and an output terminal, and a LC tank circuit connected between said input and output terminals and having one or more hyperabrupt varactor tuning diodes and a center-tapped inductor, the center tap of said inductor providing a phase-locked loop output signal RF;
   phase detector means having first and second inputs, and an output connected to said input of said RF operational amplifier of the oscillator means, said first input connected to receive said reference signal and said second input connected to receive said output signal RF; and
   coupling means connected to said varactor-controlled oscillator means for receiving said phase-locked loop output signal RF and generating in response thereto a plurality of local oscillator output signals RF/N, where $N=2^x$, $x=1, 2, 3 \ldots$.

2. The frequency synthesizer as described in claim 1 wherein said coupling means includes a plurality of series-connected emitter-coupled logic (ECL) circuits, each of said ECL circuits generating one of said local oscillator output signals RF/N.

3. The frequency synthesizer as described in claim 2 wherein each of said ECL circuits is a divide-by-two circuit having first and second complementary emitter follower outputs.

4. The frequency synthesizer as described in claim 3 wherein said first complementary emitter follower output is said output signal RF/N, and said second complementary emitter follower output forms an input to a next series-connected ECL circuit in said coupling means.

5. The frequency synthesizer as described in claim 1 further including a divider means having an input connected to said output of said oscillator means, and an output connected to said second input of said phase detector means for reducing the frequency of said phase-locked loop output signal RF by a selectable factor.

6. The frequency synthesizer as described in claim 5 further including means connected between said oscillator means, said divider means and said coupling means for receiving said phase-locked loop output signal RF and generating a plurality of replicas thereof.

7. The frequency synthesizer as described in claim 6 wherein said means for generating replicas of said phase-locked loop output signal RF includes a $1 \times 3$ power divider circuit.

8. The frequency synthesizer as described in claim 1 further including integrator/filter means connected between said phase detector means and said oscillator means for receiving the output of said detector means and producing a d.c. voltage proportional thereto.

9. The frequency synthesizer as described in claim 1 wherein said phase-locked loop output signal RF has a frequency range of an octave.

10. A frequency synthesizer of the phase-locked loop type for receiving a reference signal and generating a plurality of local oscillator output signals, comprising:
    a varactor-controlled oscillator means comprising an RF operational amplifier having an input terminal and an output terminal, and a LC tank circuit connected between said input and output terminals and having first and second hyperabrupt varactor tuning diodes and a center-tapped inductor, said first hyperabrupt varactor tuning diode connected between said input terminal and the center-tapped inductor and said second hyperabrupt varactor tuning diode connected between said output terminal and said center-tapped inductor, the center tap of said inductor providing a phase-locked loop output signal RF, said output signal RF having an octave bandwidth;
    a phase detector having first and second inputs, and an output connected to said input of said RF operational amplifier of the oscillator means, said first input of said phase detector connected to receive said reference signal;
    a programmable frequency divider having an input connected to receive the output of said varactor-controlled oscillator means, and an output connected to said second input of said phase detector; and
    a plurality of series-connected emitter-coupled logic (ECL) circuits connected to said varactor-controlled oscillator means for receiving said phase-locked loop output signal RF and generating in response thereto a plurality of local oscillator output signals RF/N, where $N=2^x$, $x=1, 2, 3 \ldots$.

11. The frequency synthesizer as described in claim 10 wherein each of said series-connected ECL circuits generates one of said local oscillator output signals RF/N.

12. The frequency synthesizer as described in claim 11 wherein each of said ECL circuits is a divide-by-two circuit having first and second complementary emitter follower outputs.

13. The frequency synthesizer as described in claim 12 wherein said first complementary emitter follower output is said local oscillator output signal RF/N and said second complementary emitter follower output forms an input to a next ECL circuit.

14. The frequency synthesizer as described in claim 12 wherein said programmable frequency divider reduces the frequency of said phase-locked loop output signal RF by a selectable factor.

15. The frequency synthesizer circuit as described in claim 10 wherein said oscillator means further include a power divider circuit connected between said programmable frequency divider and said ECL circuits for receiving said phase-locked loop output signal RF and generating a plurality of replicas thereof.

16. The frequency synthesizer as described in claim 10 further including an integrator/lowpass filter connected between said phase detector and said varactor-controlled oscillator means for receiving the output of said phase detector and producing a d.c. voltage proportional thereto.

17. A frequency synthesizer of the phase-locked loop type for receiving a reference signal and generating a plurality of local oscillator output signals, comprising:
- a varactor-controlled oscillator comprising an RF operational amplifier having an input terminal and an output terminal, and a LC tank circuit connected between said input and output terminals and having first and second hyperabrupt varactor tuning diodes and the center-tapped inductor, said first hyperabrupt varactor tuning diode connected between said input terminal and a center-tapped inductor and said second hyperabrupt varactor tuning diode connected between said output terminal and said center-tapped inductor, the center tap of said inductor providing a phase-locked loop output signal RF over an octave bandwidth;
- a phase detector having first and second inputs and an output, said first input of said phase detector connected to receive said reference signal;
- an integrator/low pass filter connected between said output of said phase detector and said input of said RF operational amplifier of the varactor-controlled oscillator for receiving an output of said phase detector and producing a d.c. voltage proportional thereto, said d.c. voltage being applied to said input of said varactor-controlled oscillator;
- a power divider circuit connected to said varactor-controlled oscillator for receiving said phase-locked loop output signal RF and generating a plurality of replicas thereof;
- a programmable frequency divider having an input connected to receive the output of said power divider circuit, and an output connected to said input of said phase detector, said programmable frequency divider for reducing the frequency of said phase-locked loop output signal RF by a selectable factor; and
- a plurality of series-connected emitter-coupled logic (ECL) circuits connected to said power divider circuit for receiving a replica of said phase-locked loop output signal RF and generating in response thereto a plurality of local oscillator output signals RF/N where $N=2^x$, $x=1, 2, 3 \ldots$

* * * * *